United States Patent
Lee et al.

(10) Patent No.: US 11,744,116 B2
(45) Date of Patent: Aug. 29, 2023

(54) ORGANIC LIGHT-EMITTING DISPLAY DEVICE AND METHOD FOR MANUFACTURING THE SAME

(71) Applicant: SAMSUNG DISPLAY CO., LTD., Yongin-si (KR)

(72) Inventors: Dongha Lee, Yongin-si (KR); Seunguk Noh, Seoul (KR); Soohyun Park, Busan (KR); Jongjang Park, Suwon-si (KR); Seoksoon Back, Suwon-si (KR); Seulgi Han, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 64 days.

(21) Appl. No.: 17/322,925

(22) Filed: May 18, 2021

(65) Prior Publication Data
US 2022/0093707 A1 Mar. 24, 2022

(30) Foreign Application Priority Data
Sep. 22, 2020 (KR) ........................ 10-2020-0122064

(51) Int. Cl.
*H10K 59/122* (2023.01)
*H10K 59/124* (2023.01)
*H10K 71/00* (2023.01)
*H10K 71/13* (2023.01)

(52) U.S. Cl.
CPC ......... *H10K 59/122* (2023.02); *H10K 59/124* (2023.02); *H10K 71/00* (2023.02); *H10K 71/135* (2023.02)

(58) Field of Classification Search
None
See application file for complete search history.

(56) References Cited

U.S. PATENT DOCUMENTS

| | | | |
|---|---|---|---|
| 8,628,986 B2 | 1/2014 | Amamiya et al. | |
| 8,664,659 B2 | 3/2014 | Kang et al. | |
| 9,105,876 B2 | 8/2015 | Choi et al. | |
| 10,804,343 B2 | 10/2020 | Li | |
| 2017/0358633 A1* | 12/2017 | Park .................... | H01L 51/5228 |

(Continued)

FOREIGN PATENT DOCUMENTS

KR 10-1581475 12/2015

*Primary Examiner* — Michelle Mandala
(74) *Attorney, Agent, or Firm* — H.C. Park & Associates, PLC (57) ABSTRACT

An organic light-emitting display device including a driving element including an active pattern and a gate electrode, an insulation layer covering the driving element, a first diode electrode disposed on the insulation layer and electrically connected to the driving element, a pixel-defining layer disposed on the insulation layer and including a side surface defining an opening overlapping at least a portion of the first diode electrode, an edge-compensation part including an organic material and disposed in a peripheral area of the opening, an organic light-emitting layer disposed on the first diode electrode and the edge-compensation part, and a second diode electrode disposed on the organic light-emitting layer, in which the edge-compensation part includes an inclined surface contacting the organic light-emitting layer, and a taper angle of the inclined surface of the edge-compensation part is less than a taper angle of the side surface of the pixel-defining layer.

6 Claims, 6 Drawing Sheets

(56) References Cited

U.S. PATENT DOCUMENTS

| | | | |
|---|---|---|---|
| 2019/0172898 A1* | 6/2019 | Choi | H01L 51/5284 |
| 2019/0372052 A1* | 12/2019 | Kishimoto | H10K 59/35 |
| 2021/0143221 A1* | 5/2021 | Kishimoto | H05B 33/12 |
| 2021/0359042 A1* | 11/2021 | Hou | H01L 27/326 |

* cited by examiner

ORGANIC LIGHT-EMITTING DISPLAY DEVICE AND METHOD FOR MANUFACTURING THE SAME

CROSS-REFERENCE TO RELATED APPLICATION

This application claims priority from and benefit of Korean Patent Application No. 10-2020-0122064 under 35 U.S.C. § 119, filed on Sep. 22, 2020, which is hereby incorporated by reference for all purposes as if fully set forth herein.

BACKGROUND

Field

Embodiments of the invention relate generally to a display device and, more specifically, to an organic light-emitting display device and a method for manufacturing the organic light-emitting display device.

Discussion of the Background

An organic light-emitting display device includes an organic light-emitting diode, which generates light in response to an electric current provided thereto. The organic light-emitting diode includes an organic light-emitting layer including a light-emitting material.

The organic light-emitting layer may be formed by various methods. Recently, a method of forming organic light-emitting layer an inkjet printing method is being developed to improve an efficiency of manufacturing a large-sized display panel.

The above information disclosed in this Background section is only for understanding of the background of the inventive concepts, and, therefore, it may contain information that does not constitute prior art.

SUMMARY

Organic light-emitting display devices constructed according to illustrative implementations of the invention and a method for manufacturing the same are capable of improving reliability.

Additional features of the inventive concepts will be set forth in the description which follows, and in part will be apparent from the description, or may be learned by practice of the inventive concepts.

An organic light-emitting display device according to an embodiment includes a driving element including an active pattern and a gate electrode overlapping the active pattern, an insulation layer covering the driving element, a first diode electrode disposed on the insulation layer and electrically connected to the driving element, a pixel-defining layer disposed on the insulation layer and including a side surface defining an opening, the opening overlapping at least a portion of the first diode electrode, an edge-compensation part including an organic material and disposed in a peripheral area of the opening, an organic light-emitting layer disposed on the first diode electrode and the edge-compensation part, and a second diode electrode disposed on the organic light-emitting layer, in which the edge-compensation part includes an inclined surface contacting the organic light-emitting layer, and a taper angle of the inclined surface of the edge-compensation part is less than a taper angle of the side surface of the pixel-defining layer.

The taper angle of the inclined surface of the edge-compensation part may be in a range of about 20° to about 40°.

The taper angle of the side surface of the pixel-defining layer may be in a range of about 40° to about 70°.

The edge-compensation part may have a surface energy greater than a surface energy of the pixel-defining layer.

The pixel-defining layer may include a fluorine-containing component, and the edge-compensation part may not include a fluorine-containing component.

The organic light-emitting layer may have an isolated pattern shape in the opening.

A method for manufacturing a display device according to another embodiment includes forming a pixel-defining layer including an opening, the opening overlapping at least a portion of a first diode electrode electrically connected to a driving element, providing a first ink including a binder component in the opening, drying the first ink to cause a solid content of the first ink move and be cohered in a peripheral area of the opening, curing the solid content of the first ink in the peripheral area of the opening to form an edge-compensation part, providing a second ink including an organic light-emitting material in the opening to form an organic light-emitting layer.

A method for manufacturing a display device according to still another embodiment includes forming a pixel-defining layer including an opening, the opening overlapping at least a portion of a first diode electrode electrically connected to a driving element, providing a first ink including a binder component in the opening, drying the first ink to form a preliminary compensation layer including a peripheral portion and a center portion, the peripheral portion having a thickness greater than a thickness of the center portion, removing the center portion of the preliminary compensation layer to form an edge-compensation part in a peripheral area of the opening, and providing a second ink including an organic light-emitting material in the opening to form an organic light-emitting layer It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

An organic light-emitting display device and a method for manufacturing an organic light-emitting display device according to embodiments of the present inventive concept will be described hereinafter with reference to the accompanying drawings, in which some embodiments are shown.

FIGS. 1, 2, 3, 4, 5, 6, 7, and 8 are cross-sectional views illustrating a method for manufacturing an organic light-emitting display device according to an embodiment. In an embodiment, an organic light-emitting display device includes a driving element and a light-emitting element electrically connected to the driving element. The driving element may include at least one thin film transistor. The light-emitting element may include an organic light-emitting diode.

Figure 1:
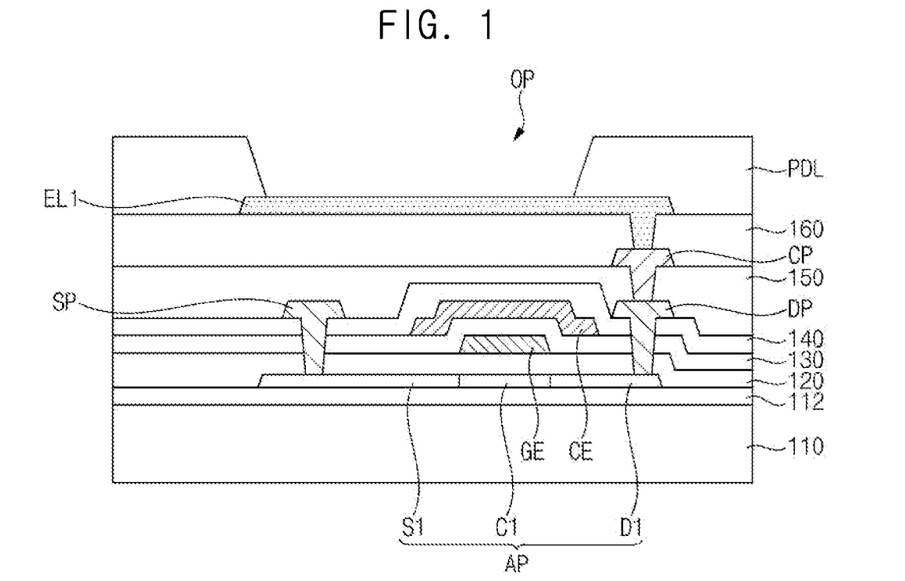
FIGS. 1, 2, 3, 4, 5, 6, 7, and 8 are cross-sectional views illustrating a method for manufacturing an organic light-emitting display device according to an embodiment.

Referring to FIG. 1, a buffer layer 112 may be formed on a base substrate 110. An active pattern AP may be formed on the buffer layer 112.

In an embodiment, the base substrate 110 may include a polymeric material. For example, the base substrate 110 may include polyethylene terephthalate, polyethylene naphthalate, polyether ketone, polycarbonate, polyarylate, polyether sulfone, polyimide, polybenzoxazole, polybenzobisoxazole, polybenzoimidazole, polybenzothiazole or a combination thereof. In an embodiment, the base substrate 110 may have a stacked structure including a polymeric film including polyimide and a barrier layer including an inorganic material.

The buffer layer 112 may prevent or suppress permeation of impurities, humidity, or external gas from underneath of the base substrate 110, and may reduce a roughness of an upper surface of the base substrate 110. For example, the buffer layer 112 may include an inorganic material such as silicon oxide, silicon nitride, silicon oxynitride or the like.

The active pattern AP may include a channel region Cl, a source region S1, and a drain region D1. The source region S1 and the drain region D1 may function as a source electrode and a drain electrode, respectively.

A first gate metal pattern may be formed on the active pattern AP. For example, the first gate metal pattern may include a gate electrode GE overlapping the channel region Cl of the active pattern AP. A first insulation layer 120 may be disposed between the active pattern AP and the first gate metal pattern.

A second gate metal pattern including a capacitor electrode CE may be formed on the first gate metal pattern. For example, the capacitor electrode CE may overlap the gate electrode GE.

A second insulation layer 130 may be disposed between the first gate metal pattern and the second gate metal pattern. A third insulation layer 140 may be formed on the second gate metal pattern.

For example, the active pattern AP may include silicon or a metal oxide semiconductor. In an embodiment, the active pattern AP may include polycrystalline silicon (polysilicon), which may be doped with n-type impurities or p-type impurities.

In another embodiment or in another transistor that is not illustrated, an active pattern may include a metal oxide semiconductor. For example, the active pattern may include a binary compound ($AB_x$), a ternary compound ($AB_xC_y$) or a quaternary compound ($AB_xC_yD_z$), which may include indium (In), zinc (Zn), gallium (Ga), tin (Sn), titanium (Ti), aluminum (Al), hafnium (Hf), zirconium (Zr), magnesium (Mg). For example, the active pattern may include zinc oxide ($ZnO_x$), gallium oxide ($GaO_x$), titanium oxide ($TiO_x$), tin oxide ($SnO_x$), indium oxide ($InO_x$), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide ($ZnZr_xO_y$), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO) or the like.

For example, the first insulation layer 120, the second insulation layer 130, and the third insulation layer 140 may each include silicon oxide, silicon nitride, silicon oxynitride, or a combination thereof. Furthermore, the first insulation layer 120, the second insulation layer 130, and the third insulation layer 140 may each include an insulating metal oxide such as aluminum oxide, tantalum oxide, hafnium oxide, zirconium oxide, titanium oxide or the like. For example, the first insulation layer 120, the second insulation layer 130 and the third insulation layer 140 may each have a single-layered structure or a multi-layered structure including silicon nitride and/or silicon oxide.

The first gate metal pattern and the second gate metal pattern may each include metal, a metal alloy, a metal nitride, a conductive metal oxide, or the like. For example, the first gate metal pattern and the second gate metal pattern may each include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof, and may have a single-layered structure or a multi-layered structure including different metal layers.

A first source metal pattern may be formed on the third insulation layer 140. The first source metal pattern may include a source pattern SP and a drain pattern DP, which electrically contact the active pattern AP. The source pattern SP and the drain pattern DP may pass through the insulation layers thereunder to contact the source region S1 and the drain region D1 of the active pattern AP, respectively. For example, the source pattern SP may transfer a power voltage to the active pattern AP. In an embodiment, the first source metal pattern may further include at least one connection pattern transferring a driving signal.

A fourth insulation layer 150 may be formed on the first source metal pattern. The fourth insulation layer 150 may compensate for a height difference of a structure disposed thereunder and planarize the substrate. The fourth insulation layer 150 may include an organic material. For example, the fourth insulation layer 150 may include an organic insulation material such as a phenol resin, an acryl resin, a polyimide resin, a polyamide resin, a siloxane resin, an epoxy resin, or the like. The fourth insulation layer 150 may be referred as to a first via insulation layer or a first organic insulation layer.

A second source metal pattern may be formed on the fourth insulation layer 150. The second source metal pattern may include a connection pattern CP, which passes through the fourth insulation layer 150 to electrically contact the drain pattern DP. For example, the second source metal pattern may further include at least one of a data line transferring a data signal and a power line transferring the power voltage For example, the first source metal pattern and the second source metal pattern may each include metal, a metal alloy, a metal nitride, a conductive metal oxide or the like. For example, the first source metal pattern and the second source metal pattern may each include Au, Ag, Al, Cu, Ni, Pt, Mg, Cr, W, Mo, Ti, Ta, or an alloy thereof, and may have a single-layered structure or a multi-layered structure including different metal layers. In an embodiment, the first source metal pattern and the second source metal patterns may each have a multi-layered structure including aluminum.

A fifth insulation layer 160 may be formed on the second source metal pattern. The fifth insulation layer 160 may include substantially the same material as the fourth insulation layer 150. The fifth insulation layer 160 may be referred as to a second via insulation layer or a second organic insulation layer.

A first diode electrode EL1 and a pixel-defining layer PDL are formed on the fifth insulation layer 160. The first diode electrode EL1 may be referred to as a first electrode or a pixel electrode.

The first diode electrode EL1 may electrically contact the connection pattern CP. In another embodiment, when the fifth insulation layer 160 and the second source metal pattern are omitted, the first diode electrode EL1 and the pixel-defining layer PDL may be formed on the fourth insulation layer 150, and the first diode electrode EL1 may electrically contact the drain pattern DP.

The first diode electrode EL1 may function as an anode. For example, the first diode electrode EL1 may be formed as a transmitting electrode or a reflecting electrode according to an emission type of the display device. When the first diode electrode EL1 is a transmitting electrode, the first diode electrode EL1 may include indium tin oxide, indium zinc oxide, zinc tin oxide, indium oxide, zinc oxide, tin oxide, or the like. When the first diode electrode EL1 is a reflecting electrode, the first diode electrode EL1 may include Au, Ag, Al, Cu, Ni, Pt, Mg, Cr, W, Mo, Ti, or a combination thereof, and may have a stacked structure further including the material that may be used for the transmitting electrode.

The pixel-defining layer PDL may include an opening OP overlapping at least a portion of the first diode electrode EL1. At least a portion of the first diode electrode EL1 may be exposed through the opening OP. The pixel-defining layer PDL may include an organic material.

In an embodiment, the pixel-defining layer PDL may be liquid-repellent. As such, when an ink is provided in the opening OP to form an organic light-emitting layer, mixture of ink drops between adjacent pixel areas may be prevented, and thus, coating uniformity may be improved.

For example, the pixel-defining layer PDL may include a fluorine-containing material to be liquid-repellent. In an embodiment, the pixel-defining layer PDL may include a binder resin and a fluorine-containing surfactant. For example, the binder resin may include a phenol resin, an acryl resin, a polyimide resin, a siloxane resin, an epoxy resin, or a combination thereof. In another embodiment, the binder resin may include a fluorine atom bonded thereto as a side group, or a main chain of the binder resin may include a fluorine-containing group such as perfluoroalkylether or the like.

The pixel-defining layer PDL may be entirely liquid-repellent, however, the inventive concepts are not limited thereto. For example, the pixel-defining layer PDL may be partially liquid-repellent. In an embodiment, a fluorine-containing layer may be formed an upper surface of the pixel-defining layer PDL Referring to FIG. 2, an ink INK is provided in the opening of the pixel-defining layer PDL. For example, the ink INK may be selectively provided in the opening by an inkjet printing method. In an embodiment, the ink INK may be discharged through a nozzle 400 of an inkjet printer.

Figure 2:
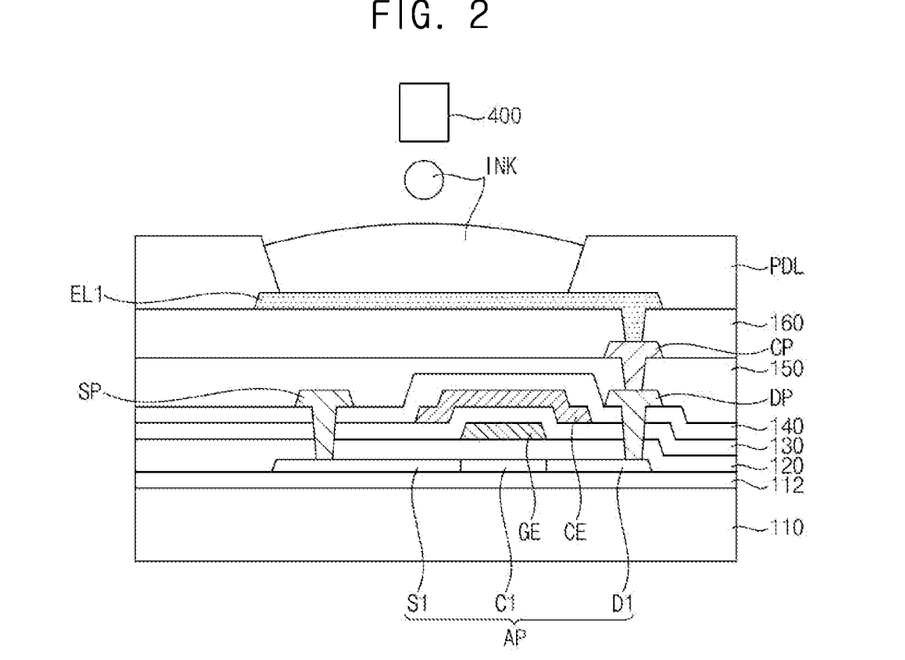

The ink INK may have a curable composition, such as a photo-curable ink, which may be cured by UV ray or the like, or a thermo-curable ink.

In an embodiment, the ink INK may include a binder component, a polymerization initiator, and a solvent. The binder component may include a reactive monomer, a binder polymer, or a combination thereof. The reactive monomer may include an acrylate compound, an epoxy compound, an oxetan compound, or a combination thereof. The binder polymer may include a phenol resin, an acryl resin, a siloxane resin, an epoxy resin, or a combination thereof.

The solvent may include methyl ethyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, 2-ethoxy propanol, 2-methoxy propanol, 3-methoxy butanol, 2-butoxy ethanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, dipropylene glycol monomethyl ether, or a combination thereof.

In an embodiment, a content of the solvent in the ink may be about 50 wt % to about 95 wt %. When a content of the solvent is excessively large, it may be difficult to form an edge-compensation part having a desired thickness. On the other hand, when a content of the solvent is excessively small, the residue of a solid content of the ink may be undesirably increased on a center portion of the first diode electrode EL1.

The ink INK may further include an additive such as a surfactant, as desired.

Figure 3:
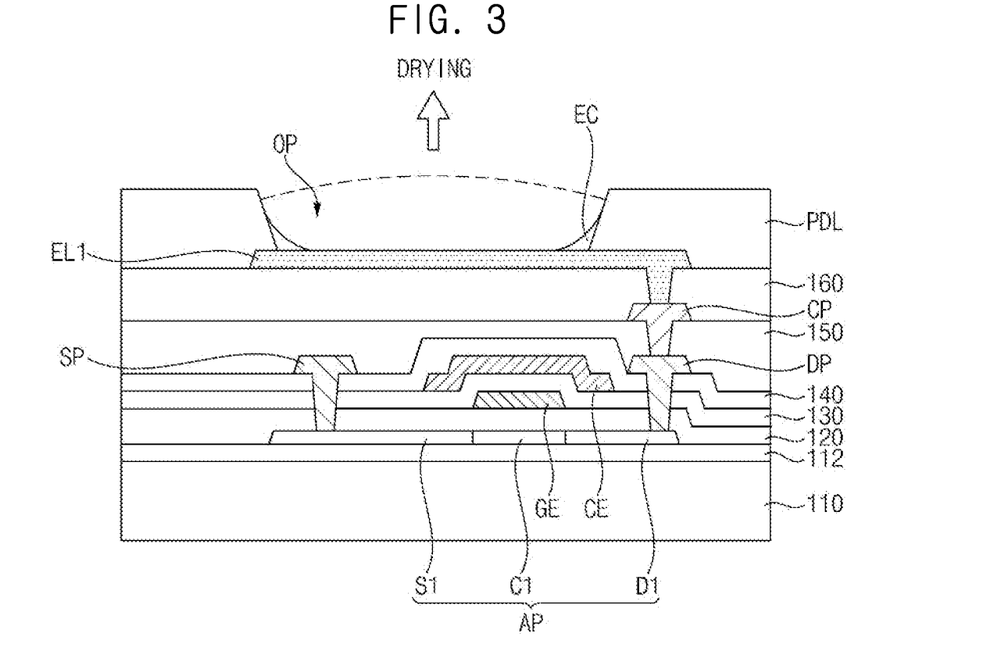

Referring to FIG. 3, the ink is dried. When the ink disposed in the opening OP of the pixel-defining layer PDL is dried, the solvent in the ink may be removed, and a solid content including the binder component may move and be cohered in a peripheral area of the opening OP by coffee ring effect. The solid content of the ink cohered in the peripheral area of the opening OP may then be cured to form an edge-compensation part EC. The ink for forming the edge-compensation part EC may be referred to as a first ink.

Figure 4:
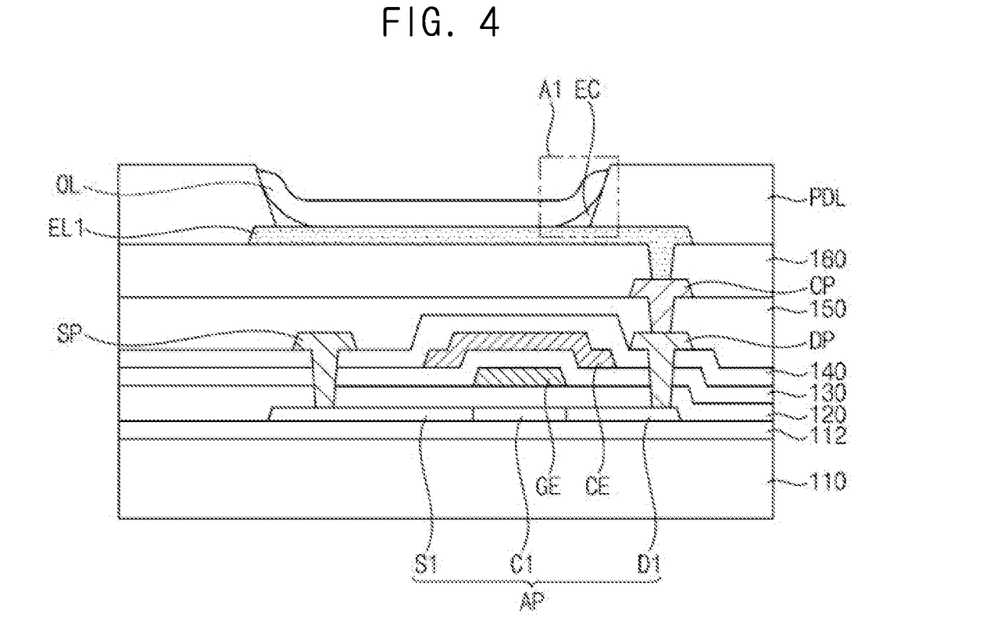

Referring to FIG. 4, an organic light-emitting layer OL is formed in the opening OP of the pixel-defining layer PDL. In an embodiment, an ink including an organic light-emitting material may be provided in the opening OP, and then be dried or cured to form the organic light-emitting layer OL. The ink may include at least one of a hole-injection material, a hole-transporting material, an electron-injection material, an electron-transporting material, a light-emitting host material, and a light-emitting dopant material. The ink for forming the organic light-emitting layer OL may be referred to as a second ink.

The organic light-emitting layer OL may include an emission layer, and may further include at least one of a hole-injection layer (HIL), a hole-transporting layer (HTL), an electron-transporting layer (ETL), and an electron-injection layer (EIL) to have a stacked structure. The emission layer may include a light-emitting host material and a dopant material.

In an embodiment, the organic light-emitting layer OL may emit red light, green light, or blue light. In another embodiment, the organic light-emitting layer OL may emit white light. The organic light-emitting layer OL emitting white light may have a multi-layered structure including a red light-emitting layer, a green light-emitting layer, and a blue light-emitting layer, or a single-layered structure including a mixture of a red-emitting material, a green-emitting material, and a blue-emitting material.

Figure 5:
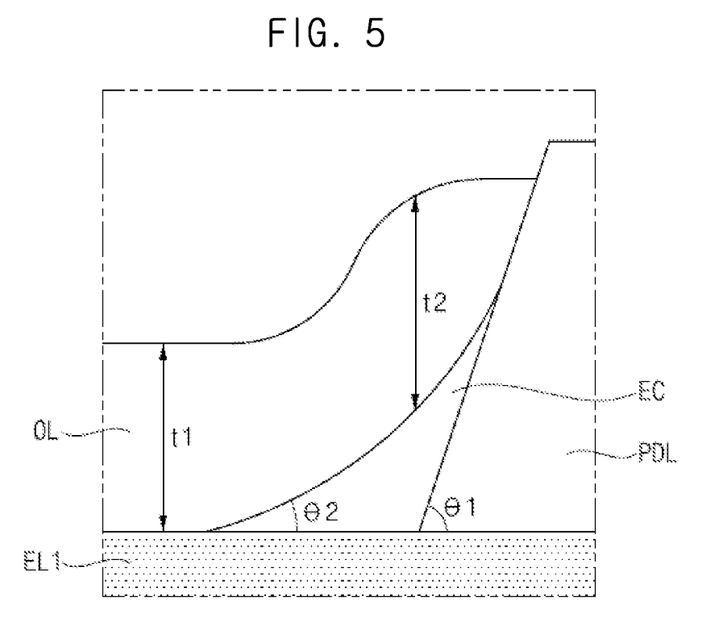

FIG. 5 is an enlarged cross-sectional view illustrating the region 'A1' of FIG. 4. Referring to FIGS. 4 and 5, the edge-compensation part EC may contact an upper surface of the first diode electrode EL1 and a side surface of the pixel-defining layer PDL. The organic light-emitting layer OL may be formed on the first diode electrode EL1 and the edge-compensation part EC.

In an embodiment, since the edge-compensation part EC is disposed in the peripheral area of the opening OP, a difference between a thickness t1 of the organic light-emitting layer OL in a center portion and a thickness of t2 thereof in a peripheral portion may be reduced. In this manner, a thickness uniformity of the organic light-emitting layer OL may be improved. As such, deterioration of light-emitting efficiency and durability of the organic light-emitting layer OL, which may otherwise be caused by a thickness difference of the organic light-emitting ayer OL, may be improved or prevented.

In an embodiment, the edge-compensation part EC may include an inclined surface extending from the upper surface of the first diode electrode EL1 toward the side surface of the pixel-defining layer PDL. The inclined surface may contact the organic light-emitting layer OL. In an embodiment, a taper angle θ2 of the inclined surface of the edge-compensation part EC may be less than a taper angle θ1 of the side surface of the pixel-defining layer PDL. For example, the taper angle θ2 of the inclined surface of the edge-compensation part EC may be at least about 20° and less than about 40°. When the taper angle θ2 of the inclined surface of the edge-compensation part EC is excessively large, a thickness uniformity of the organic light-emitting layer OL may not be sufficiently improved. When the taper angle θ2 of the inclined surface of the edge-compensation part EC is excessively small, a contact interface between the organic light-emitting layer OL and the first diode electrode EL1 may be reduced thereby substantially reducing a light-emitting area.

For example, the taper angle θ1 of the side surface of the pixel-defining layer PDL may be in a range of about 40° to about 70°.

In an embodiment, the edge-compensation part EC may have a surface energy greater than a surface energy of the pixel-defining layer PDL. For example, the edge-compensation part EC may have a wettability greater than a wettability of the pixel-defining layer PDL. For example, the pixel-defining layer PDL may include a fluorine-containing component such as a fluorine-containing surfactant, and the edge-compensation part EC may not include a fluorine-containing component.

In an embodiment, at least a portion of the pixel-defining layer PDL, for example, an area adjacent to the upper surface of the pixel-defining layer PDL may have a relatively small surface energy to be liquid-repellant. When the edge-compensation part EC has a small surface energy as the pixel-defining layer PDL, a thickness uniformity of the organic light-emitting layer OL may be deteriorated.

Figure 6:
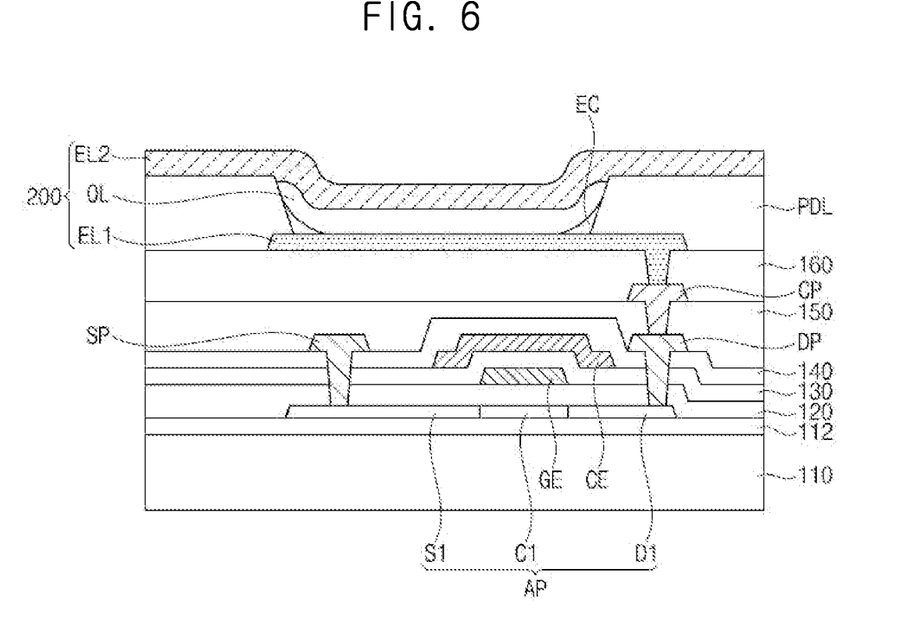

Referring to FIG. 6, a second diode electrode EL2 is formed on the organic light-emitting layer OL. The second diode electrode EL2 may be referred to as a second electrode or a common electrode. For example, the second diode electrode EL2 may function as a cathode. The second diode electrode EL2 may be formed as a transmitting electrode or a reflecting electrode according to an emission type of the display device. For example, the second diode electrode EL2 may include metal, a metal alloy, a metal nitride, a metal fluoride, a conductive metal oxide, or a combination thereof.

The second electrode EL2 may be formed as a common layer extending continuously over a plurality of pixels in a display area, without being limited thereto.

Figure 7:
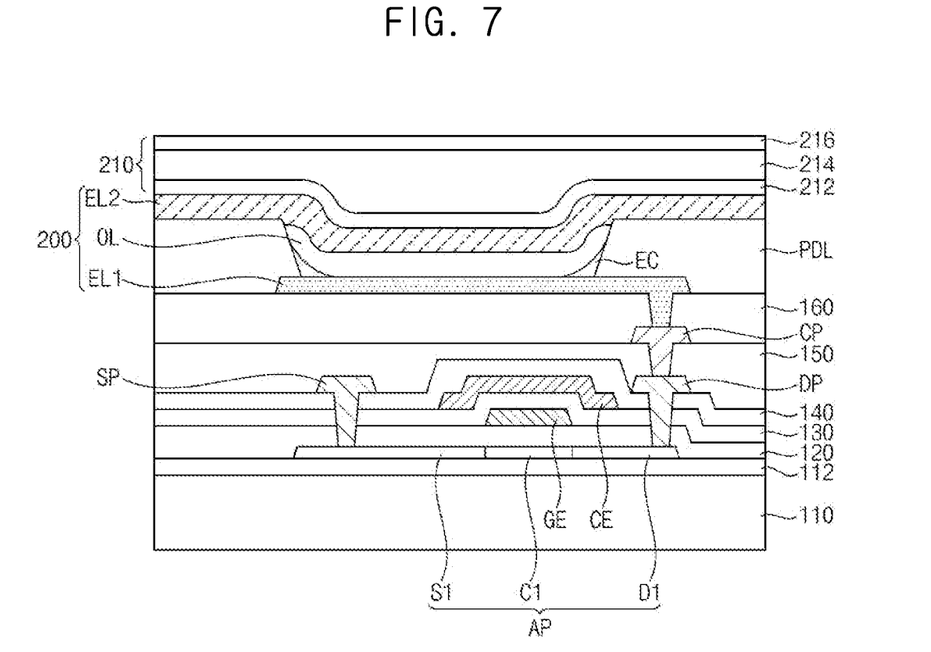

Referring to FIG. 7, an encapsulation layer 210 may be formed on an organic light-emitting diode 200. The encapsulation layer 210 may have a stacked structure of an inorganic thin film and an organic thin film. For example, the encapsulation layer 210 may include a first inorganic thin film 212, an organic thin film 214 disposed on the first inorganic thin film 212, and a second inorganic thin film 216 disposed on the organic thin film 214.

For example, the organic thin film may include a cured polymer resin such as a cured acryl resin, a cured epoxy resin, or the like. The cured polymer resin may be formed by cross-linking reaction of monomers. In an embodiment, the inorganic thin films may include silicon oxide, silicon nitride, silicon oxynitride, aluminum oxide, tantalum oxide, hafnium oxide, zirconium oxide, titanium oxide, or a combination thereof.

The inventive concepts are not limited to a particular structure of the encapsulation layer 210. For example, a display device according to another embodiment may include an encapsulation substrate disposed on the organic light-emitting diode 200.

Figure 8:
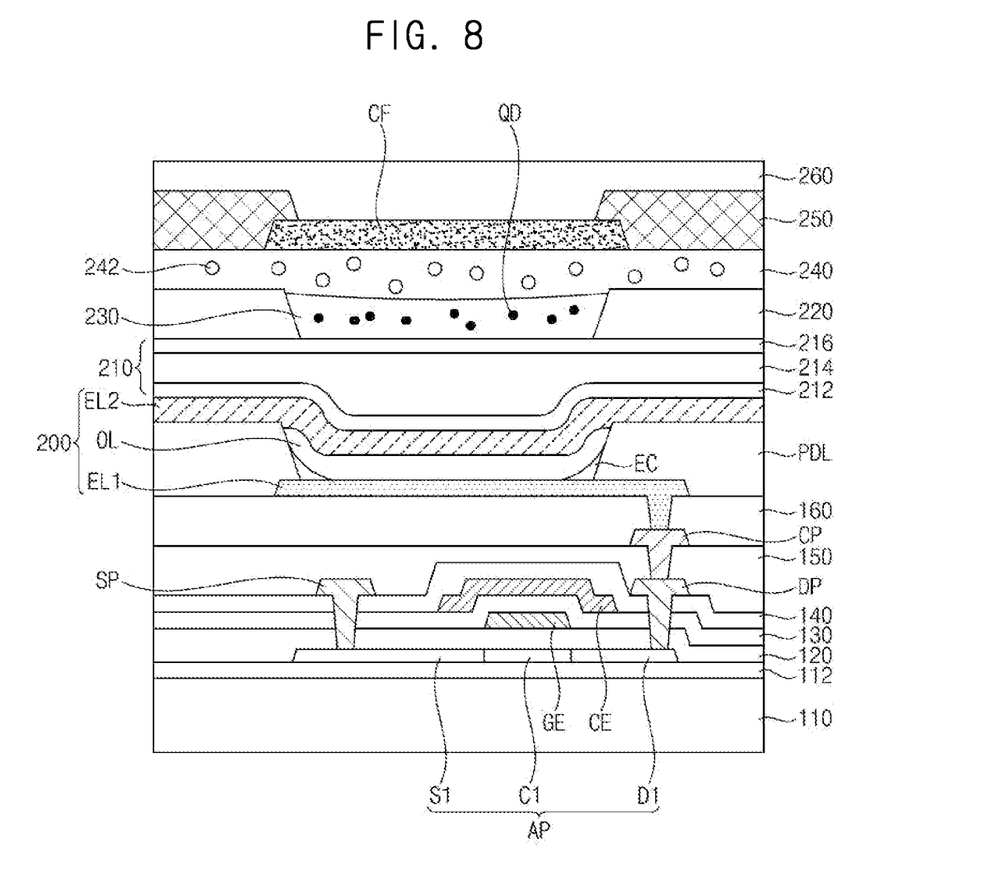

Referring to FIG. 8, at least one of a color-converting part 230 and a color filter CF may be formed on the organic light-emitting diode 200.

For example, the color-converting part 230 and a partition wall 220 may be formed on the encapsulation layer 210.

The partition wall 220 may form a space to receive an ink in the process of forming the color-converting part 230. As such, the partition wall 220 may surround a side surface of the color-converting part 230.

For example, the partition wall 220 may include an organic insulation material such as a phenol resin, an acryl resin, a polyimide resin, a siloxane resin, an epoxy resin, or the like.

In an embodiment, the partition wall 220 may include a light-blocking material. For example, at least a portion of the partition wall 220 may include a light-blocking material such as a pigment, a dye, carbon-black, or the like.

In an embodiment, the color-converting part 230 may include wavelength-converting particle QD.

For example, the wavelength-converting particle QD may include a quantum dot. The quantum dot may be defined as a nano-crystalline semiconductor material. The quantum dot may absorb light incident thereto and emit light having a wavelength different from the incident light. For example, the quantum dot may have a diameter equal to or less than about 100 nm. In an embodiment, the quantum dot may have a diameter of about 1 nm to about 20 nm.

For example, the quantum dot may include a II-VI group compound, a III-V group compound, a IV-VI group compound, a IV group element, a IV group compound, or a combination thereof.

The II-VI group compound may include a binary compound selected from CdSe, CdTe, ZnS, ZnSe, ZnTe, ZnO, HgS, HgSe, HgTe, MgSe, MgS and a combination thereof, a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a combination thereof, or a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe and a combination thereof.

The III-V group compound may include a binary compound selected from GaN, GaP, GaAs, GaSb, AlN, AlP, AlAs, AlSb, InN, InP, InAs, InSb and a combination thereof, a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP and a combination thereof, or a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a combination thereof.

The IV-VI group compound may include a binary compound selected from SnS, SnSe, SnTe, PbS, PbSe, PbTe and a combination thereof, a ternary compound selected from SnSeS, SnSeTe, SnSTe, PbSeS, PbSeTe, PbSTe, SnPbS, SnPbSe, SnPbTe and a combination thereof, or a quaternary compound selected from SnPbSSe, SnPbSeTe, SnPbSTe and a combination thereof.

The IV group element may include Si, Ge, or a combination thereof. The IV group compound may include a binary compound selected from SiC, SiGe, and a combination thereof.

The quantum dot may have a core-shell structure including a core and a shell which surrounds the core. In an embodiment, the core and the shell may include different materials, without being limited thereto.

The quantum dot may be dispersed in a resin part. For example, the resin part may include an epoxy resin, an acryl resin, a phenolic resin, a melamine resin, a cardo resin, an imide resin, or a combination thereof.

In an embodiment, the color-converting part 230 may further include a scattering particle. The scattering particle may scatter light incident thereto without substantially changing the wavelength of the incident light to reduce a light path in the color-converting part 230.

The scattering particle may include a metal oxide or an organic material. For example, the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), or the like. For example, the organic material may include an acryl resin, an urethane resin, or the like.

In an embodiment, the organic light-emitting diode 200 may emit blue light. The color-converting part 230 may change a color of blue light to emit red light or green light. Blue light that is not color-changed by the color-converting part 230 may be blocked by the color filter CF. As such, the pixel area may emit blue light or green light.

A pixel area, which is not illustrated, may not include the color-converting part 230 thereby emitting blue light. As such, the display device may emit red light, green light, and blue light to display an image from combination thereof.

A low-refractive layer 240 may be formed on the color-converting part 230. The low-refractive layer 240 may have a refractivity less than that of the color-converting part 230. The low-refractive layer 240 may increase a light-extracting efficiency thereby increasing the brightness and the durability of the display device. For example, the low-refractive layer 240 may have a refractivity equal to or less than about 1.3.

The low-refractive layer 240 may include a hollow particle to have a desired refractivity. In an embodiment, the low-refractive layer 240 may include a hollow particle 242 dispersed in a resin part.

The hollow particle 242 may include an inorganic material. For example, the hollow particle 242 may include silica ($SiO_2$), magnesium fluoride ($MgF_2$), iron oxide ($Fe_3O_4$), or a combination thereof.

The resin part of the low-refractive layer 240 may include an acryl resin, a siloxane resin, an urethane resin, an imide resin, or a combination thereof, and a suitable material may be selected in consideration of a refractivity and ease of manufacture.

A light-blocking part 250 and the color filter CF may be formed on the low-refractive layer 240. In an embodiment, the color filter CF may include a red filter, a green filter, or a blue filter depending on a color of light to be emitted. The light-blocking part 250 may define a light-emitting area and a light-blocking area of the display device.

For example, the light-blocking part 250 may partially cover the color filter CF. However, the inventive concepts are not limited thereto, and in another embodiment, after a light-blocking part including an opening is formed, a color filter may be formed in the opening.

A protective layer 260 may be formed on the light-blocking part 250 and the color filter CF. For example, the protective layer 260 may include an inorganic material, an organic material, or a combination thereof.

In another embodiment, a color-converting part and a color filter may not be formed on the encapsulation layer 210, and may be formed on an individual substrate. For example, after a cover substrate including a color-converting part and a color filter is formed, an array substrate including a pixel structure may be combined with the cover substrate.

According to an embodiment, an edge-compensation part is formed in a peripheral area of an opening of a pixel-defining layer. An organic light-emitting layer is then formed on the edge-compensation part and a first diode electrode through a liquid process, such as an inkjet printing method. In this manner, a thickness uniformity of the organic light-emitting layer may be improved.

Furthermore, the edge-compensation part may be formed without an additional photo process by using coffee ring effect of an ink. As such, a manufacturing efficiency may be improved.

Figure 9:
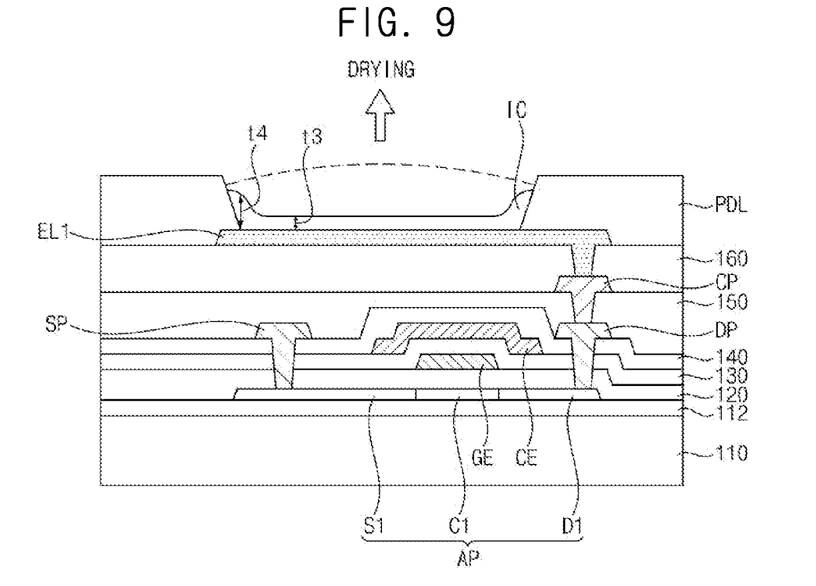
FIGS. 9 and 10 are cross-sectional views illustrating a method for manufacturing an organic light-emitting display device according to an embodiment.
Figure 10:
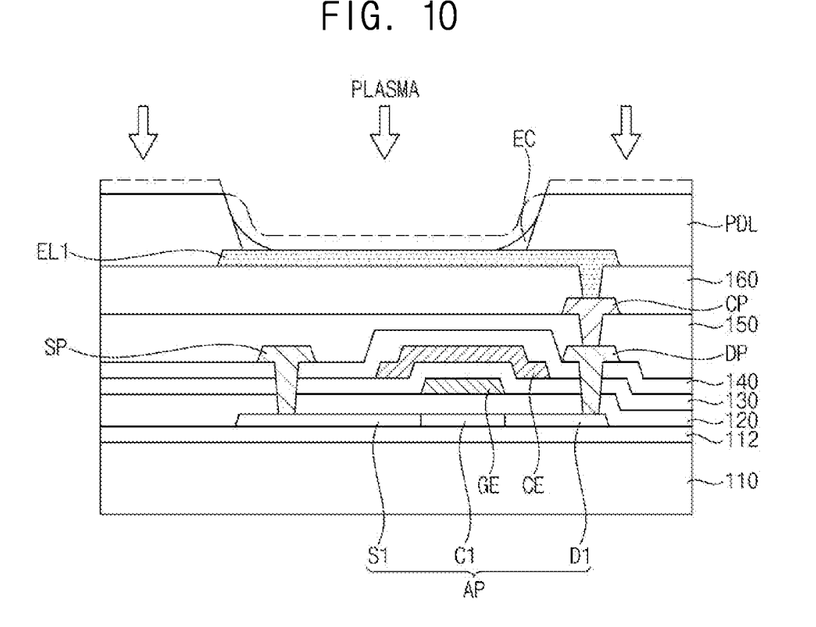

FIGS. 9 and 10 are cross-sectional views illustrating a method for manufacturing an organic light-emitting display device according to an embodiment.

Referring to FIG. 9, an ink is provided in an opening of a pixel-defining layer PDL. The ink is dried and cured to form a preliminary compensation layer IC.

In an embodiment, a thickness t4 of the preliminary compensation layer IC in a peripheral portion, which is adjacent to a side surface of the pixel-defining layer PDL, may be greater than a thickness t3 of the preliminary compensation layer IC in a center portion, which is spaced apart from the side surface of the pixel-defining layer PDL. When the ink in the opening is dried, a binder component in the ink may move to a peripheral area adjacent to the side surface of the pixel-defining layer PDL and form the preliminary compensation layer IC having different thicknesses along the opening.

For example, the ink may be selectively provided in the opening by an inkjet printing method. The ink may include a photo-curable ink, which may be cured by UV ray or the like, or a thermo-curable ink.

The ink may have substantially the same composition as the first ink described above, and a solid content of the ink may be retained on the center portion of a first diode electrode EL1 depending on a content, drying condition, a solvent, or the like, thereby forming the preliminary compensation layer IC.

Referring to FIGS. 9 and 10, a center portion of the preliminary compensation layer IC may be removed to form an edge-compensation part EC.

In an embodiment, a plasma gas may be provided to the preliminary compensation layer IC to remove the center portion of the preliminary compensation layer IC. The preliminary compensation layer IC has a greater thickness in the peripheral portion. As such, at least a portion of the preliminary compensation layer IC may be retained in the peripheral portion even when the plasma gas is provided until the center portion of the preliminary compensation layer IC is entirely removed. In this manner, the edge-compensation part EC may be formed. In this case, an upper portion of the pixel-defining layer PDL may be partially removed during the process of forming the edge-compensation part EC.

Embodiments may be applied to various display devices. For example, embodiment may be applied to vehicle-display device, a ship-display device, an aircraft-display device, portable communication devices, display devices for display or information transfer, a medical-display device, etc.

According to embodiments, an edge-compensation part is formed in a peripheral area of an opening of a pixel-defining layer. An organic light-emitting layer is formed on the edge-compensation part and a first diode electrode through a liquid process such as an inkjet printing method. As such, a thickness uniformity of the organic light-emitting layer may be improved.

Furthermore, the edge-compensation part according to embodiments may be formed without an additional photo process by using coffee ring effect of an ink. As such, a manufacturing efficiency may be improved.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light-emitting display device comprising:
   a driving element including an active pattern and a gate electrode overlapping the active pattern;
   an insulation layer covering the driving element;
   a first diode electrode disposed on the insulation layer and electrically connected to the driving element;
   a pixel-defining layer disposed on the insulation layer and including a side surface defining an opening, the opening overlapping at least a portion of the first diode electrode;
   an edge-compensation part comprising an organic material, disposed in a peripheral area of the opening, and contacting the first diode electrode;
   an organic light-emitting layer disposed on the first diode electrode and the edge-compensation part; and
   a second diode electrode disposed on the organic light-emitting layer,
   wherein the edge-compensation part includes an inclined surface contacting the organic light-emitting layer, and a taper angle of the inclined surface of the edge-compensation part is less than a taper angle of the side surface of the pixel-defining layer.

2. The organic light-emitting display device of claim 1, wherein the taper angle of the inclined surface of the edge-compensation part is in a range of about 20° to about 40°.

3. The organic light-emitting display device of claim 2, wherein the taper angle of the side surface of the pixel-defining layer is in a range of about 40° to about 70°.

4. The organic light-emitting display device of claim 1, wherein the edge-compensation part has a surface energy greater than a surface energy of the pixel-defining layer.

5. The organic light-emitting display device of claim 4, wherein the pixel-defining layer includes a fluorine-containing component, and the edge-compensation part does not include a fluorine-containing component.

6. The organic light-emitting display device of claim 1, wherein the organic light-emitting layer has an isolated pattern shape in the opening.

* * * * *